US006319017B1

(12) United States Patent
Kuo

(10) Patent No.: US 6,319,017 B1
(45) Date of Patent: Nov. 20, 2001

(54) ELECTRICAL CARD CONNECTOR

(75) Inventor: Ming Lun Kuo, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/827,627

(22) Filed: Apr. 6, 2001

(30) Foreign Application Priority Data

Dec. 15, 2000 (TW) ............................................. 89221828

(51) Int. Cl.[7] .............................. H01R 12/00; H05K 1/00

(52) U.S. Cl. ............................................. 439/64; 439/377

(58) Field of Search ............................ 439/64, 377, 325, 439/328, 570, 569, 92

(56) References Cited

U.S. PATENT DOCUMENTS 5,297,966 * 3/1994 Brennian, Jr. et al. ................ 439/64
5,478,246 * 12/1995 Cheng .................................... 439/64
5,588,850 * 12/1996 Pan et al. ............................... 439/92
6,045,366 * 4/2000 Motomu ................................ 439/64
6,089,882 * 7/2000 Costello ................................ 439/95
6,135,792 * 10/2000 Kuo ....................................... 439/92

* cited by examiner

*Primary Examiner*—Tulsidas Patel
*Assistant Examiner*—Hae Moon Hyeon
(74) *Attorney, Agent, or Firm*—Wei Te Chung

(57) ABSTRACT

An electrical card connector (1) in accordance with the present invention comprises an insulative housing (10), a plurality of terminals (20) received in the insulative housing, a shield (30) covering the insulative housing, a metal ear (40) connecting with the shield and an ejector 50 fixed on both sides of the shield. The metal ear assembled to the housing comprises a body (41), an engaging section (44) and a buckle section (42) extending respectively from the two sides of the body. The engaging section is adapted to soldering onto the printed circuit board (PCB) (6) and then ground the interferential signals on the metal ear onto the PCB. While the buckle section is locking on the top face (10*a*) of the housing so that the metal ear can be assembled to the housing firmly when the electrical card connector subjects to the external force in the opposite direction of the PCB vertically upwards.

5 Claims, 9 Drawing Sheets

ELECTRICAL CARD CONNECTOR

BACKGROUND OF THE INVENTION

1. Field of the Invention

The present invention relates to an electrical card connector mounted onto a printed circuit board (PCB), and particularly to an electrical connector having metal ears mounted firmly thereon.

2. Description of the Prior Art

As the popularity of notebook computers increases, integrated circuit (IC) cards are becoming more common for increasing storage capacity or for interfacing the notebook computers with other devices. Card connectors are commonly used to connect motherboards of the computers with the cards. Most current IC cards and card connectors conform to the standard of Personal Computer Memory Card International Association (PCMCIA).

Referring to FIG. 6 & FIG. 8, a conventional electrical card connector includes an insulative housing 80, a shell 90 and a metal ear 700 connected with the shell 90. Also referring to FIG. 7 & FIG. 9, the metal ear 700 comprises a base 702, an engaging section 704 and a flat 706. The base 702 includes a plurality of embosses **702*a* on either side of the base. When the metal ear 700 is assembled onto the lower face 82, the embosses 702*a* intervene with a dowel slot 84 defined in the insulative housing 80 so that the metal ear 700 can be fixed into the insulative housing 80**.

However, the dowel slot 84 extends from a lower face 82 of the insulative housing 80 to a top face 86 but not through the top face 86. The metal ear 700 connects the insulative housing 80 only via embosses **702*a*. When the insulative housing 80 comes under an upward force, the engaging section 704 of the metal ear 700 can lacerate the dowel slot 84 of the insulative housing 80 easily and make the metal ear 700 disengage from the insulative housing 80 though the engaging section 704 of the metal ear 700 is soldered onto the PCB 200**.

Hence, an improved electrical card connector is desired to overcome the disadvantages of the prior art card connector.

SUMMARY OF THE INVENTION

An object of the present invention is to provide an electrical card connector whose metal ear can be assembled to its insulative housing firmly.

An electrical card connector in accordance with the present invention comprises an insulative housing comprising a long base and two side arms respectively connected with the long base, each side arm having an upper recess and a lower recess, a protrusion on the upper recess, and a first oriented groove on an inner wall surface thereof, a plurality of terminals received in the insulative housing; and a pair of metal ears each comprising a body received in the side arm, an engaging section received in the lower recess for soldering onto a printed circuit board (PCB), a buckle section received in the upper recess of the side arm, a bent portion secured in the first oriented groove of the side arm, the buckle section having an opening engaged with the protrusion, the engaging section and the buckle section cooperatively clamping to the side arm.

Other objects, advantages and novel features of the invention will become more apparent from the following detailed description of the present embodiment when taken in conjunction with the accompanying drawings.

DETAILED DESCRIPTION OF THE INVENTION

Figure 1:
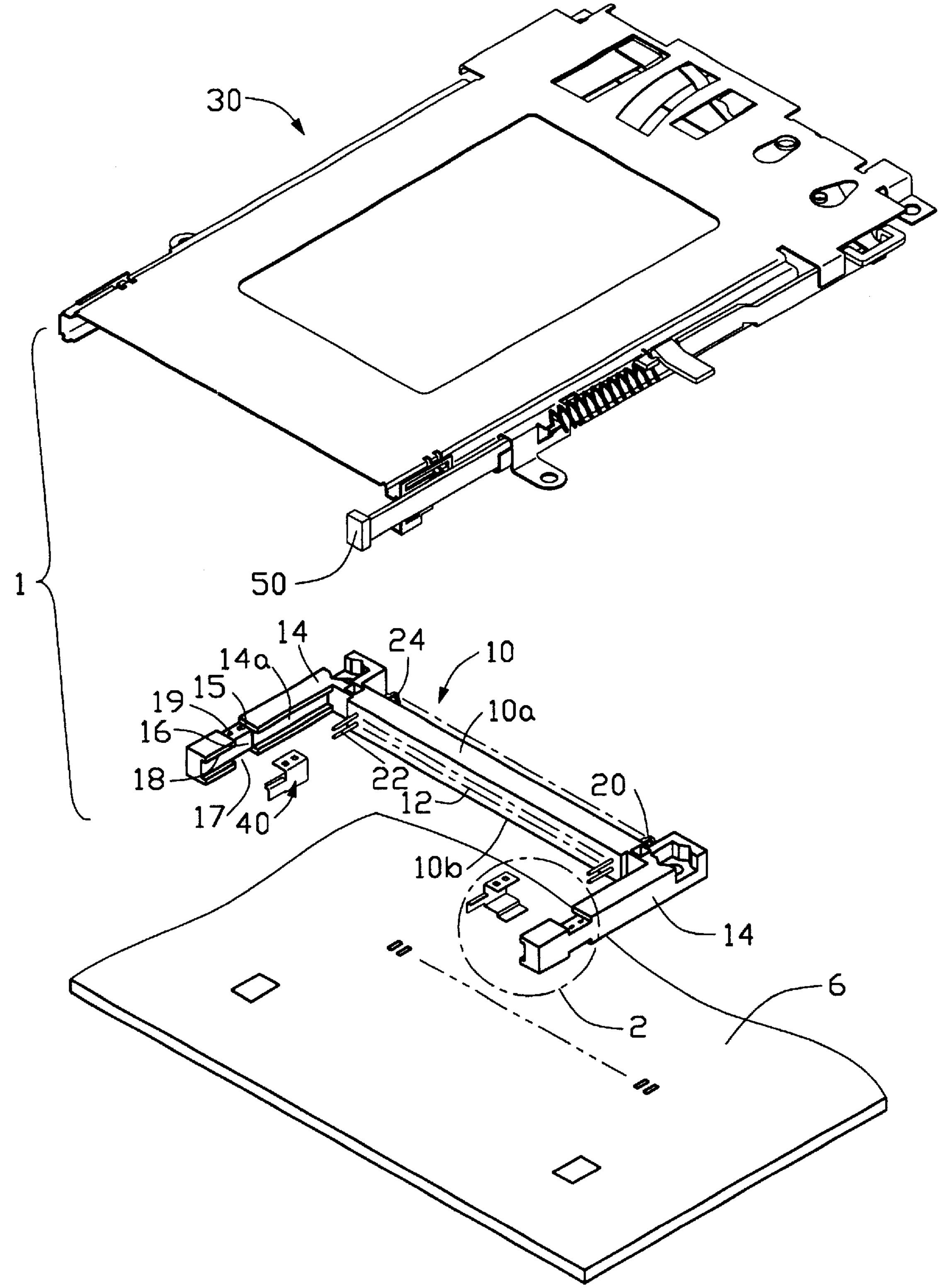
FIG. 1 is an exploded perspective view of an electrical card connector in accordance with the present invention.
Figure 2:
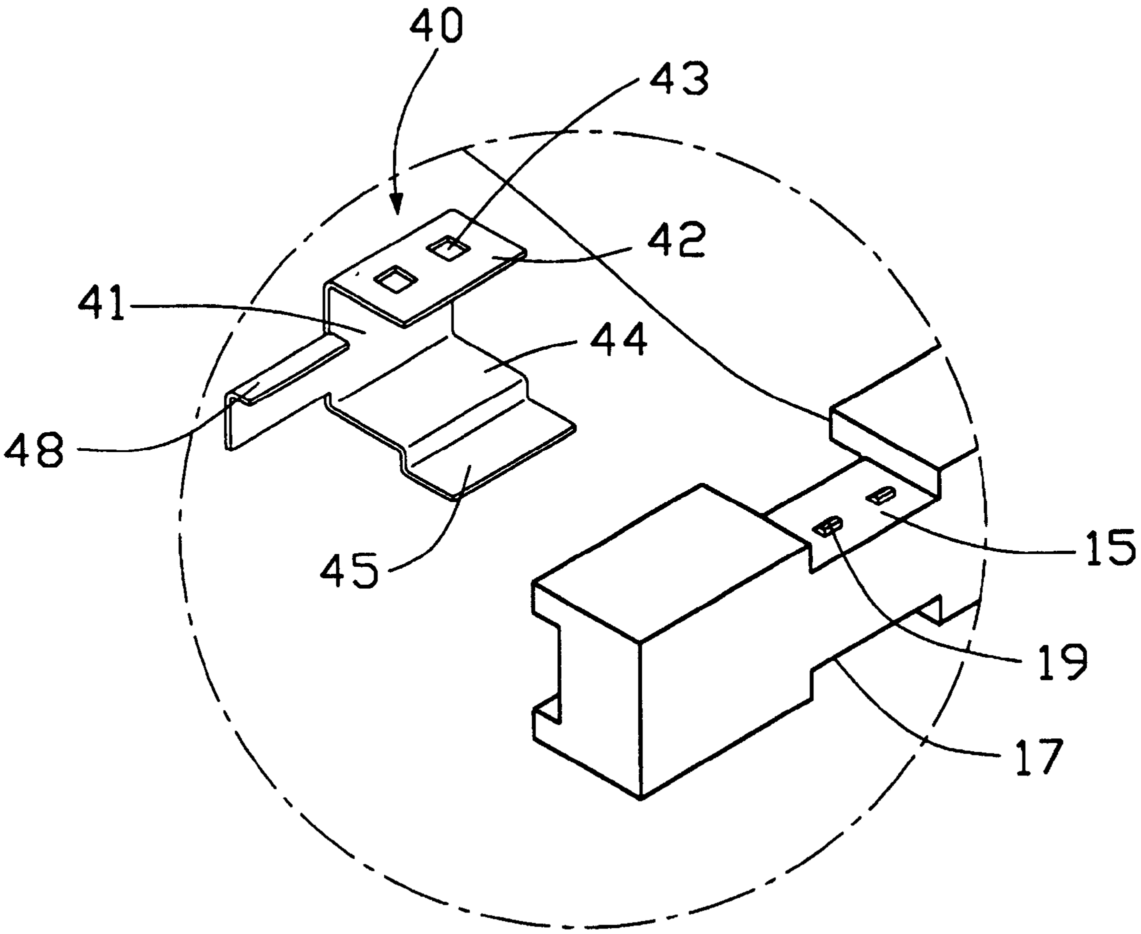
FIG. 2 is an enlarged view of a portion of the connector in FIG. 1.
Figure 3:
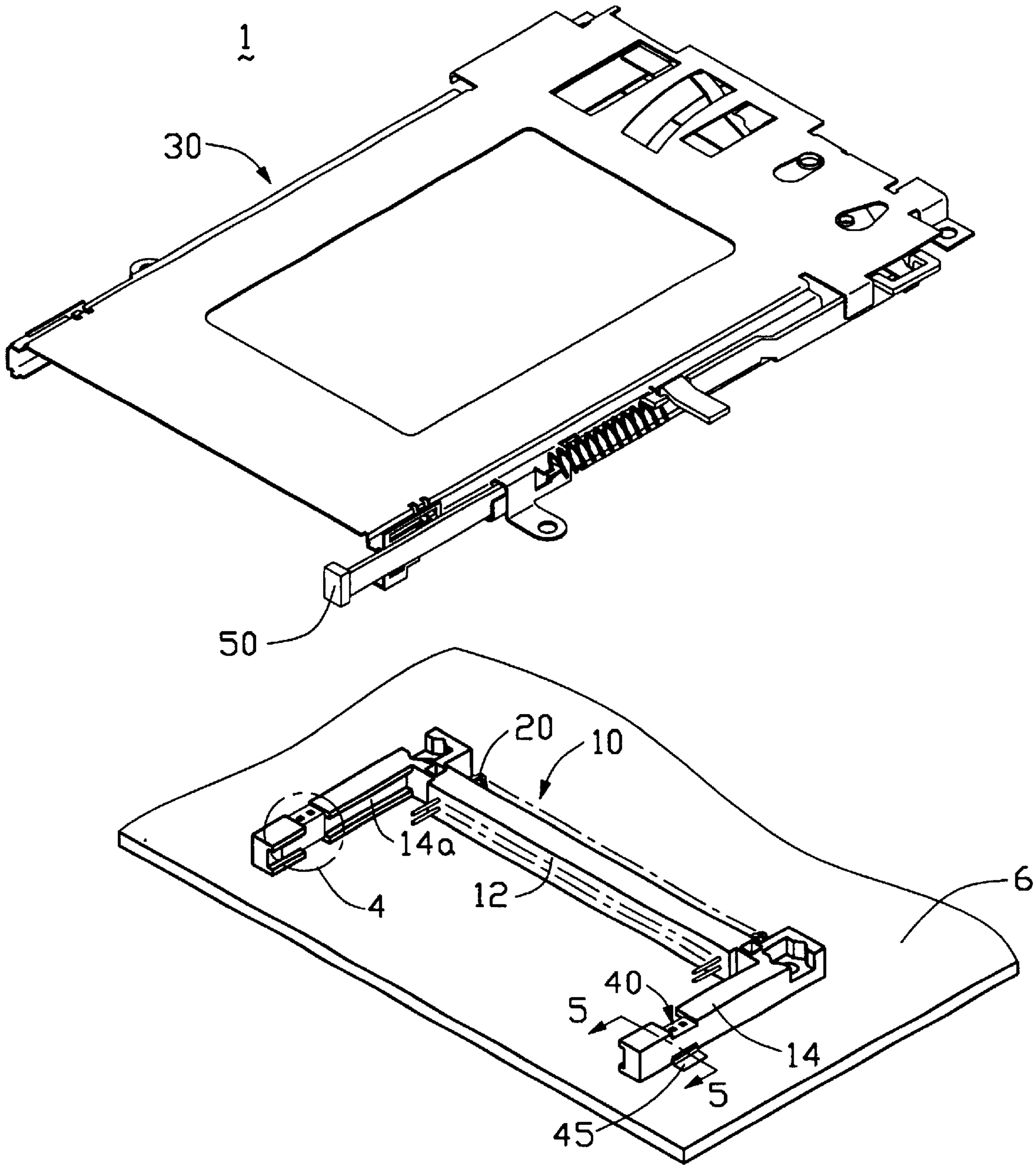
FIG. 3 is a partly assembled perspective view of an electrical card connector in accordance with the present invention wherein the shield is not fixed onto the insulative housing.

Referring to FIG. 1 through FIG. 3, an electrical card connector 1 in accordance with the present invention comprises an insulative housing 10, a plurality of terminals 20 received in the insulative housing 10, a shield 30 partly covering the insulative housing 10, a pair of metal ears 40 fixed on the insulative housing 10 and an ejector 50 respectively fixed on one side of the shield 30.

The insulative housing 10 having a top face **10*a* and a lower face 10*b* comprises a long base 12 and a pair of side arms 14 extending vertically from the base 12. The two side arms 14 respectively define opposite grooves 14*a* for guiding insertion of an electrical card (not shown). Each topside face of the side arm 14 distal from the base 12 forms an upper recess 15 having one or more protrusions 19 thereon. Each side arm 14 also forms an inner wall 16 and a lower recess 17. The inner wall 16 of each side arm 14 defines a first oriented groove/slit 18**.

Figure 4:
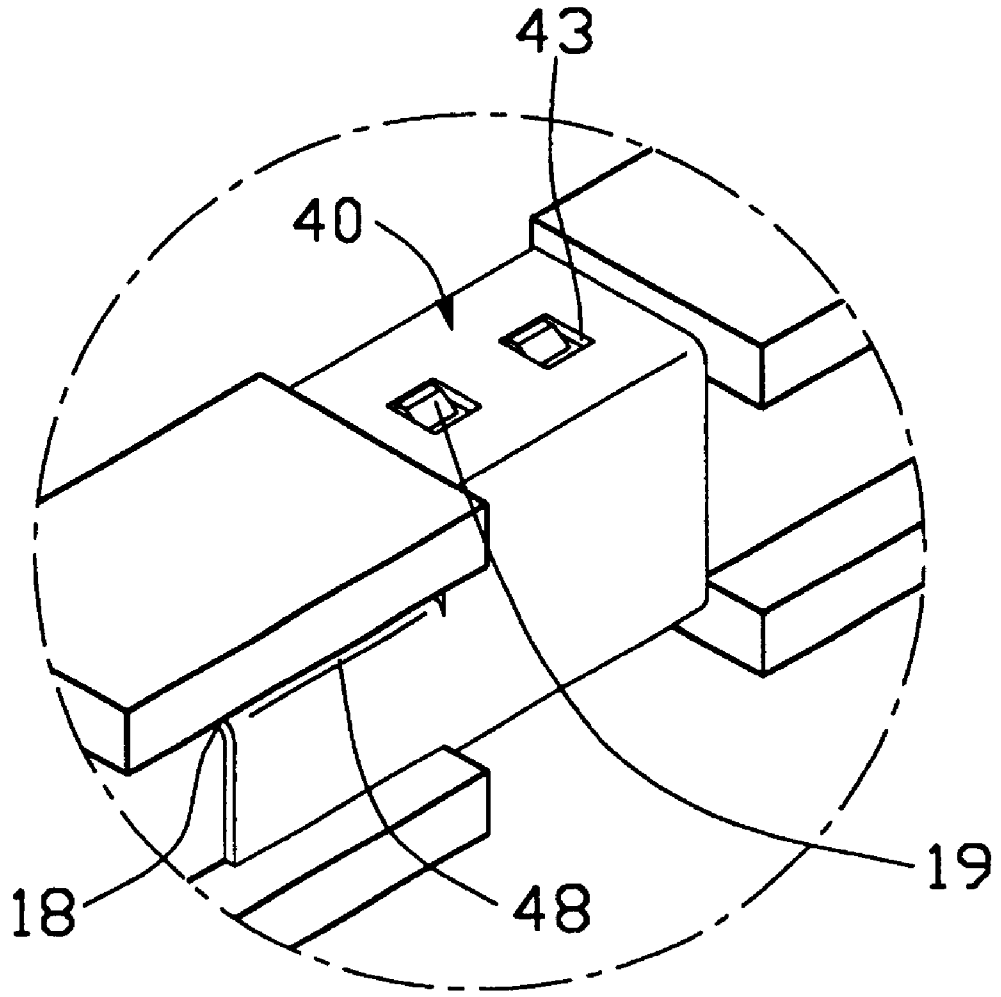
FIG. 4 is an enlarged cut-away view showing a portion of the insulative housing to which a metal ear is mounted.
Figure 5:
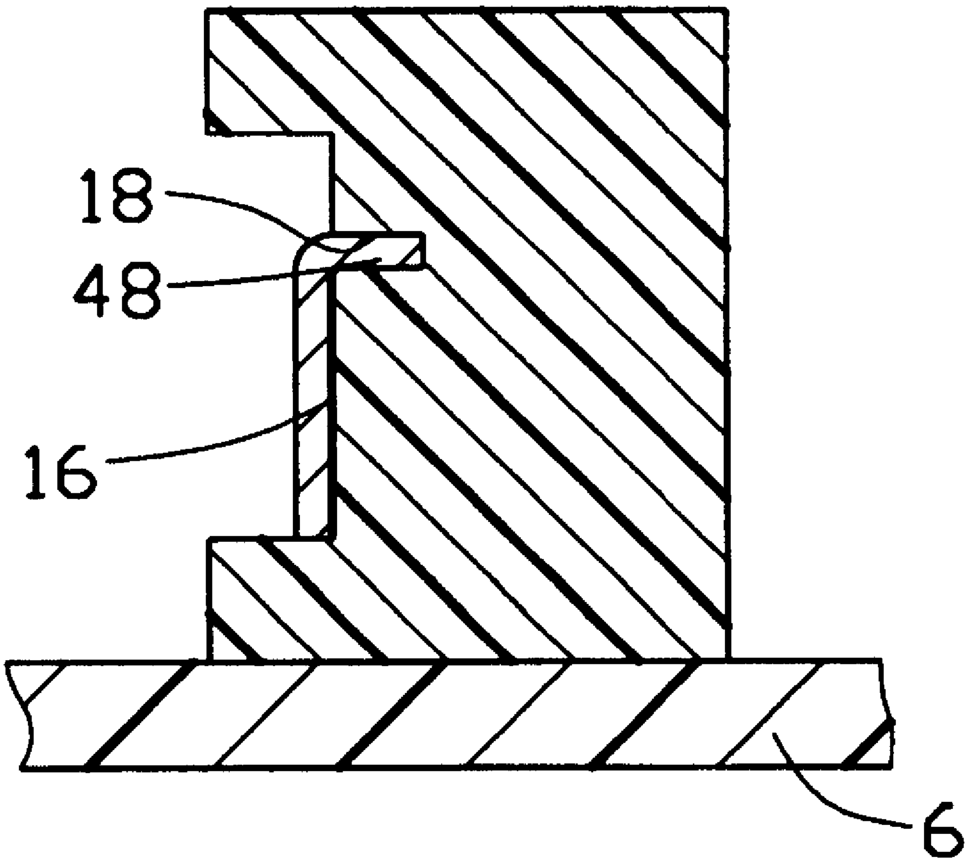
FIG. 5 is a sectional view taken along line 5—5 of FIG. 3.
Figure 6:
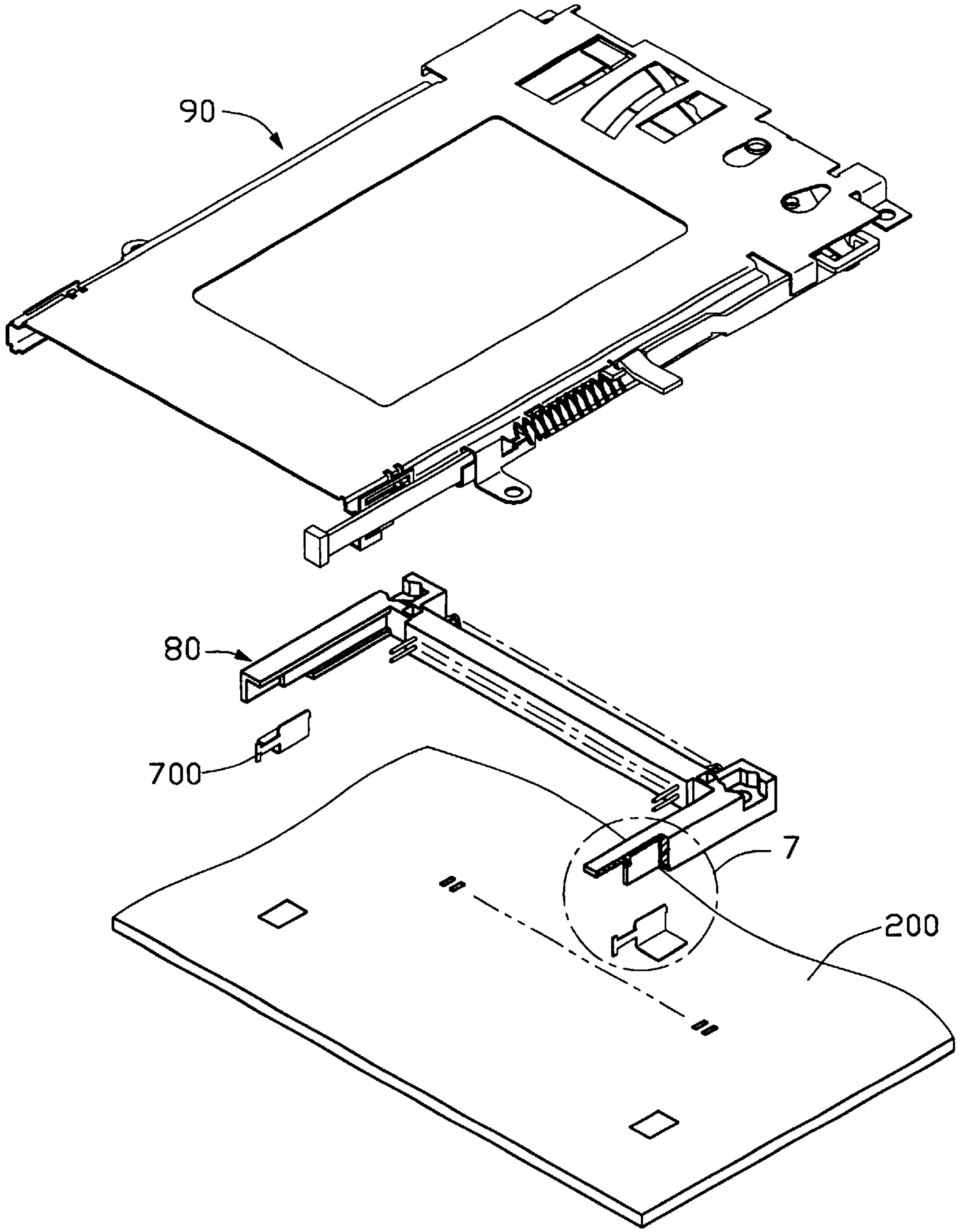
FIG. 6 (PRIOR ART)
FIG. 6 is an exploded perspective view of a conventional electrical card connector to be mounted on a PCB.
Figure 7:
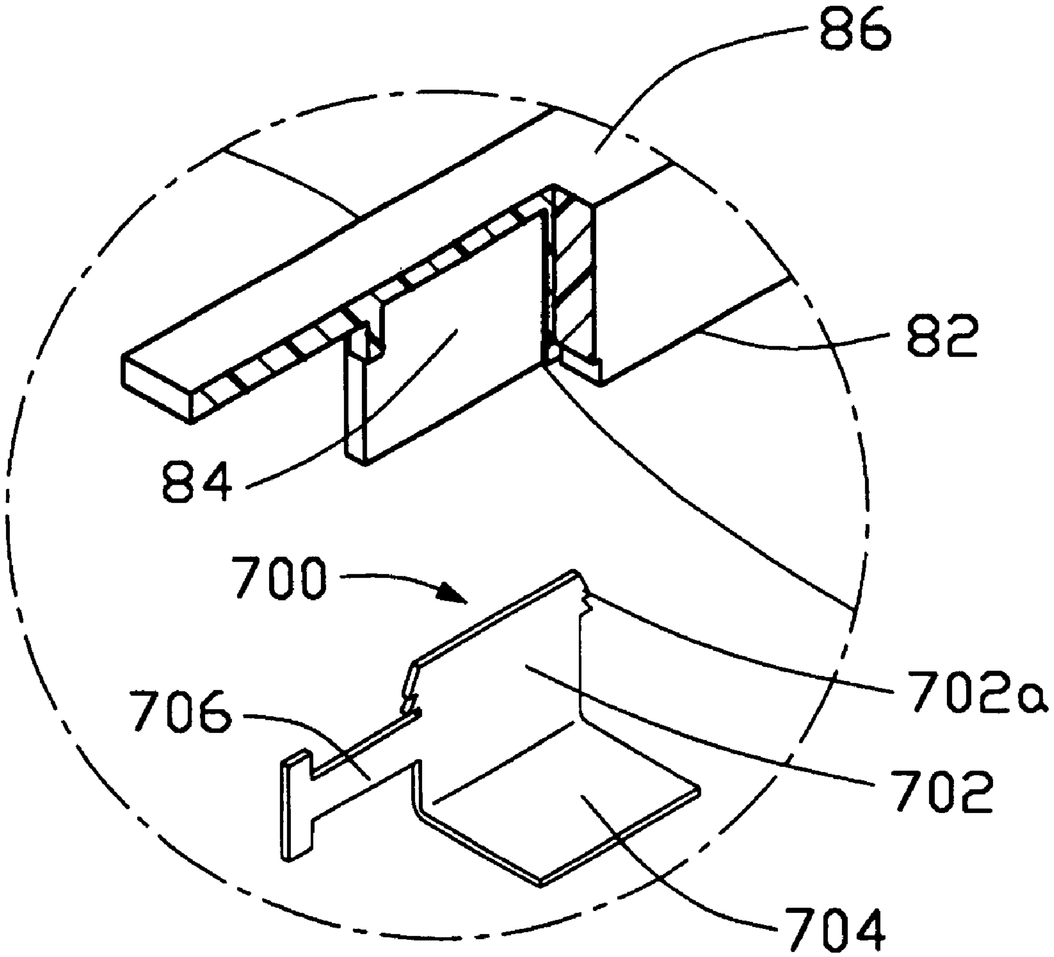
FIG. 7 (PRIOR ART)
FIG. 7 is an enlarged view of a portion of FIG. 6.
Figure 8:
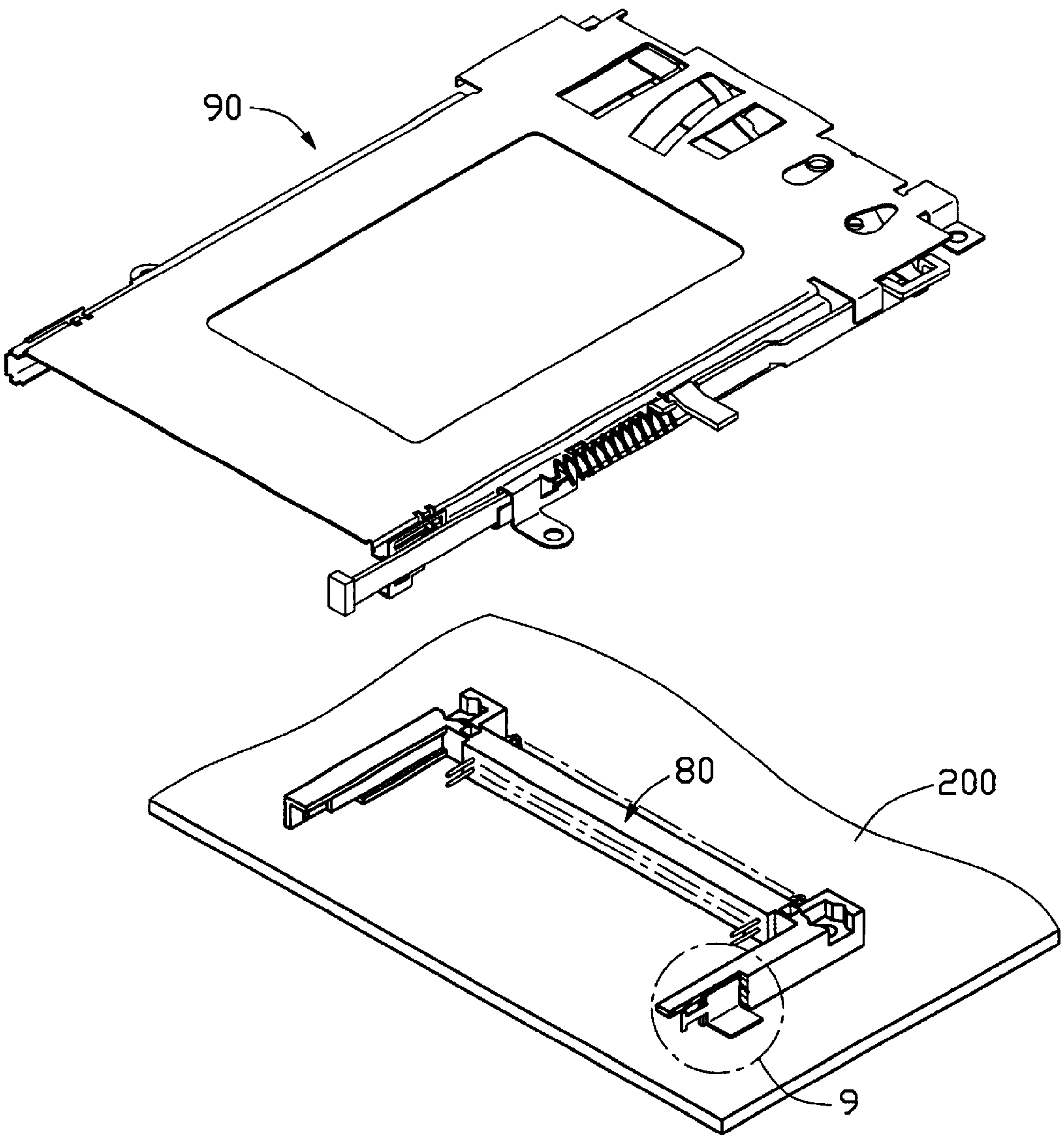
FIG. 8 (PRIOR ART)
FIG. 8 is a partly assembled perspective view of the conventional electrical card connector of FIG. 6.
Figure 9:
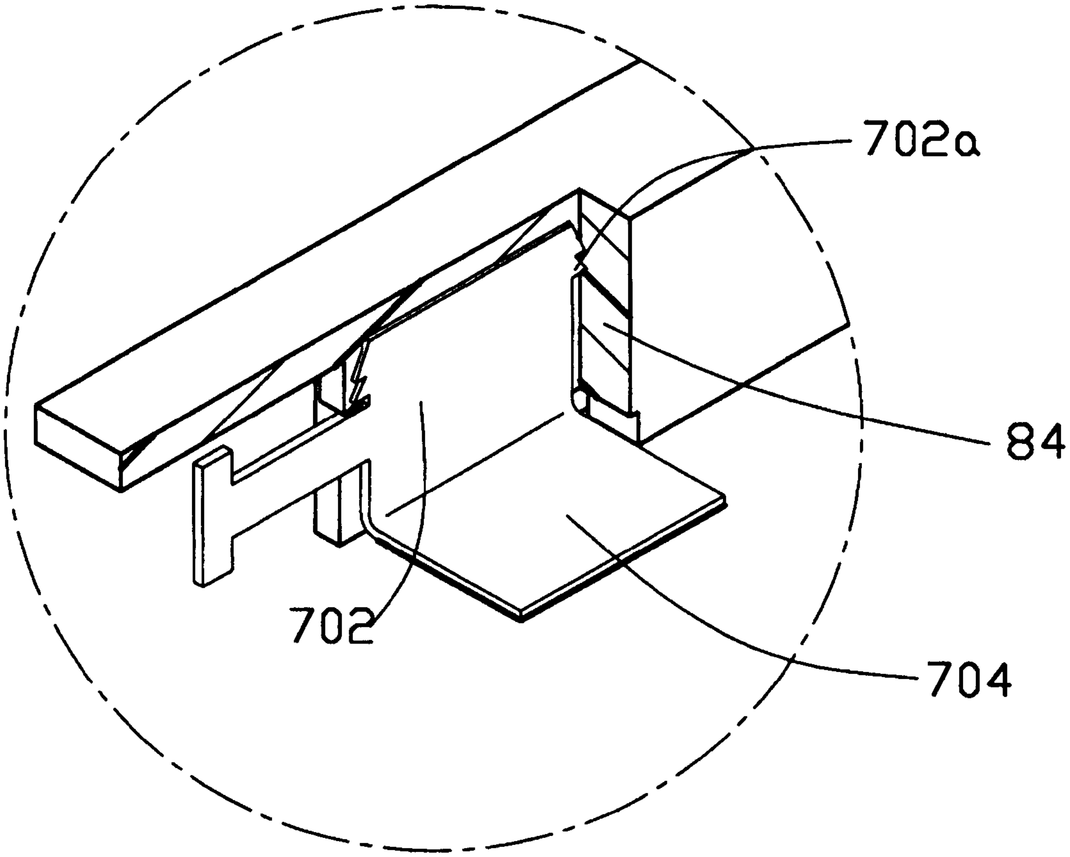
FIG. 9 (PRIOR ART)
FIG. 9 is an enlarged view of a portion of FIG. 8.

Referring to FIG. 2, the metal ear 40 which is made of a metal sheet comprises a body 41, a lower engaging section 44 perpendicularly extending from the body 41 and an upperbuckle section 42 perpendicularly extending from the body 41. The engaging section 44 is bent to extend a mounting portion 45. The mounting portion 45 can solder onto the PCB 6 (referring to FIG. 3). The buckle section 42 defines a corresponding number of openings 43 for fastening to the protrusions 19 of the side arm 14. At the same time, the front side of the body 41 extends a bent portion 48 which can be secured in a groove/slit 18 of the side arm 14 (referring to FIG. 4 and FIG. 5).

Referring to FIGS. 1 through 4, in assembly, the metal ear 40 inserts into the partly assembled electrical card connector 1 in a direction parallel the PCB 6 from the inside of the two side arms 14 of the insulative housing 10. The engaging section 44 of the metal ear 40 is received in the lower recess 17 of the side arm 14 and the openings 43 of the buckle section 42 receives the protrusions 19 in the upper recess 15. The body 40, the engaging section 44 and the buckle section 42 cooperatively clamp to the side arm of the insulative housing 10. When the electrical card connector 1 is subject to an upward force vertical to the PCB 6, the engaging section 44 and the bent portion 48 all can make the metal ear 40 firmly fix to the side arm 14 of the insulative housing 10 so as to prevent the side arms 14 of the insulative housing 10 from moving in a direction tending to separate from the PCB 6.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical card connector, comprising:

an insulative housing comprising a long base and two side arms respectively connected with the long base, each side arm having an upper recess and a lower recess, a protrusion on the upper recess, and a first oriented groove on an inner wall surface thereof;

a plurality of terminals received in the insulative housing; and a pair of metal ears each comprising a body received in the side arm, an engaging section received in the lower recess including a mounting portion for soldering onto a printed circuit board (PCB), a buckle section received in the upper recess of the side arm, a bent portion secured in the first oriented groove of the side arm, the buckle section having an opening engaged with the protrusion, the engaging section and the buckle section cooperatively clamping to the side arm.

2. The electrical card connector as claimed in claim 1, wherein the engaging section and the buckle section of the metal ear extend in same direction and vertical to the inner wall surface.

3. The electrical card connector as claimed in claim 2, wherein the buckle section of the metal ear is parallel to the PCB.

4. The electrical card connector as claimed in claim 3, wherein the metal ear is sidewardly mounted to the side arm along a parallel direction to the PCB.

5. An electrical card connector comprising:

an insulative housing comprising a long base and two side arms respectively connected at two opposite ends of the base, each of said side arms defining along a front-to-back direction an inner groove of an inner face thereof;

a plurality of terminals disposed in said base; and a metal ear mounted to each of said side arms, said metal ear including a vertical body received within the corresponding inner groove and abutting against the corresponding inner wall, a buckle section and an engaging section respectively horizontally extending laterally and outwardly positioned on upper and lower faces of the corresponding side arm, a mounting portion extending from the engaging section and out of an outer face of the corresponding side arm; wherein a bent portion laterally and outwardly extends from a front side of the vertical body and into a corresponding slit in the side arm, and said bent portion is positioned between said engaging section and said buckle section in a vertical direction, and is offset from said engaging section and said buckle section in said front-to-back direction.

* * * * *